(12) United States Patent
Schicht et al.

(10) Patent No.: US 11,038,492 B2
(45) Date of Patent: *Jun. 15, 2021

(54) CLOCK PULSE GENERATION CIRCUIT (71) Applicant: Apple Inc., Cupertino, CA (US)

(72) Inventors: Steven F. Schicht, Austin, TX (US); William R. Weier, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/544,591

(22) Filed: Aug. 19, 2019

(65) Prior Publication Data

US 2019/0372559 A1    Dec. 5, 2019

Related U.S. Application Data

(63) Continuation of application No. 15/970,986, filed on May 4, 2018, now Pat. No. 10,389,335.

(51) Int. Cl.
| | |
|---|---|
| *G05F 1/04* | (2006.01) |
| *H03K 3/00* | (2006.01) |
| *H03K 3/027* | (2006.01) |
| *H03K 19/17736* | (2020.01) |
| *H03K 19/00* | (2006.01) |
| *H03K 3/017* | (2006.01) |

(52) U.S. Cl.
CPC .......... *H03K 3/027* (2013.01); *H03K 3/017* (2013.01); *H03K 19/0016* (2013.01); *H03K 19/1774* (2013.01)

(58) Field of Classification Search
CPC .... G06F 1/10; G06F 1/04; G06F 1/08; H03K 5/135; G11C 7/22

USPC .................................................. 327/291–298
See application file for complete search history.

(56) References Cited

U.S. PATENT DOCUMENTS

| | | | |
|---|---|---|---|
| 5,059,818 A * | 10/1991 | Witt .......................... | G06F 1/08 327/172 |
| 6,320,437 B1 | 11/2001 | Ma | |
| 6,366,127 B1 | 4/2002 | Friedman et al. | |
| 6,661,262 B1 * | 12/2003 | Curran ............... | H03K 5/00006 327/116 |
| 7,733,143 B2 | 6/2010 | Guo et al. | |
| 7,782,093 B2 | 8/2010 | Dray | |
| 7,839,195 B1 | 11/2010 | Feng et al. | |
| 8,493,125 B2 | 7/2013 | Kikuchi | |
| 8,638,153 B2 | 1/2014 | Ge et al. | |
| 8,803,575 B2 | 8/2014 | Terrovitis | |

(Continued)

*Primary Examiner* — Quan Tra
(74) *Attorney, Agent, or Firm* — Kowert, Hood, Munyon, Rankin & Goetzel, P.C.

(57) ABSTRACT

In various embodiments, a clock pulse generation circuit may include a combination circuit, a first set-reset (SR) latch, a second SR latch, and a pulse generator. The combination circuit may be configured to generate a set signal based on an external clock signal. The first SR latch may be configured to generate an internal clock signal based on the reset signal and the set signal. The second SR latch may be configured to generate the reset signal based on the external clock signal and a reset pulse signal. The pulse generator may be configured to generate the reset pulse signal based on the internal clock signal. As a result, the clock pulse generation circuit may be configured to prevent the set signal from being asserted when the reset signal is asserted.

20 Claims, 6 Drawing Sheets

(56) References Cited

U.S. PATENT DOCUMENTS

| | | |
|---|---|---|
| 9,154,117 B2 | 10/2015 | Jung et al. |
| 9,224,451 B2 | 12/2015 | Fujisawa |
| 9,564,881 B2 | 2/2017 | Ye et al. |
| 9,564,901 B1 | 2/2017 | Chow et al. |
| 2006/0273838 A1 | 12/2006 | Berthold et al. |
| 2007/0279092 A1 | 12/2007 | Wood et al. |
| 2011/0140750 A1 | 6/2011 | Kojima |
| 2013/0223152 A1 | 8/2013 | Passerini et al. |
| 2013/0297986 A1* | 11/2013 | Cohen ............... G06F 11/1048 714/763 |
| 2017/0170829 A1 | 6/2017 | Liu et al. |

\* cited by examiner

CLOCK PULSE GENERATION CIRCUIT

The present application is continuation of U.S. application Ser. No. 15/970,986, filed May 4, 2018 (now U.S. Pat. No. 10,389,335); which is incorporated by reference herein in its entirety.

BACKGROUND

Technical Field

This disclosure relates generally to a clock pulse generation circuit.

Description of the Related Art

Integrated circuits utilizing digital logic may include a number of circuits whose operation is synchronized to a clock signal. The types of circuits that operate according to a clock signal include flip-flops, various types of memory, counters, and so on.

As integrated circuits have become denser, clock signals have become faster (i.e., higher frequency). Furthermore, sequential circuits typically have timing budgets, which is an allotted amount of time in which to complete operations when a received clock signal is in a certain state. Different circuits may have different timing constraints within a system. As a result, in some systems, multiple clock signals may be used.

SUMMARY

In various embodiments, a clock pulse generation circuit is disclosed where the circuit is configured such that the circuit prevents a set signal from being asserted when a reset signal is asserted. In particular, the clock pulse generation circuit may generate a set signal based on an external clock signal and a reset signal (or an indication of the reset signal). Accordingly, the clock pulse generation circuit may, in some cases, prevent a signal (e.g., reset) from being masked or otherwise overridden in situations where set and reset are asserted at the same time. Additionally, because the set signal may be generated based on the reset signal (or the indication thereof), a single pulse generator (e.g., a reset pulse generator) may be used, as opposed to a clock generation circuit that includes a set pulse generator and a reset pulse generator. As a result, in some cases, area, power consumption, circuit verification time, or any combination thereof may be reduced, as compared to a clock generation circuit that includes a set pulse generator and a reset pulse generator.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical, such as an electronic circuit), More specifically, this formulation is used to indicate that this structure is arranged to perform the one or more tasks during operation. A structure can be said to be "configured to" perform some task even if the structure is not currently being operated. A "memory device configured to store data" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f)

during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a processing circuit that includes three latches, the terms "first latch" and "second latch" can be used to refer to any two of the three latches, and not, for example, just logical latches 0 and 1.

When used in the claims, the term "or" is used as an inclusive or and not as an exclusive or. For example, the phrase "at least one of x, y, or z" means any one of x, y, and z, as well as any combination thereof (e.g., x and y, but not z).

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION

In clock pulse generation circuits including set-reset (SR) latches, a set signal and a reset signal being received at the same time may result in incorrect or inconsistent operation. Additionally, because such signals are often periodic, the set signal and reset signal may be received at the same time in multiple cycles. Various factors may cause the set signal and the reset signal to be received at the same time. For example, a clock pulse generation circuit may be configured such that a set signal and a reset signal for a latch are both generated based on different respective delays from a rising edge of an external clock. Voltage variation, overclocking the external clock, the external clock signal having an asymmetric duty cycle, the external clock cycle being asserted for a longer amount of time than an internal clock cycle, or other factors may result in the set signal and reset signal overlapping at least partially.

A clock pulse generation circuit is disclosed herein that prevents a set signal from being asserted based on an indication of a reset signal. As a result, in some embodiments, the clock pulse generation circuit may prevent the set signal, which may assert an internal clock pulse, from being asserted without a corresponding reset signal, which may terminate the internal clock pulse. In some embodiments, a combination circuit may generate the set signal based on an external clock signal and the indication of the reset signal. A first set-reset (SR) latch may generate an internal clock signal based on the set signal and the reset signal. A pulse generator may generate a reset pulse signal based on the internal clock signal (e.g., based on a delayed version of the internal clock signal). A second SR latch may generate an indication of the reset signal or the reset signal itself based on the reset pulse signal. The indication of the reset signal may be sent to the combination circuit. Because the set signal is generated based on the indication of the reset signal, the clock pulse generation circuit may prevent the set signal from being asserted when the reset signal is asserted.

In some cases, preventing the set signal from being asserted when the reset signal is asserted may prevent the set signal from overriding the reset signal. If the set signal overrides the reset signal consistently (e.g., because a set signal for a next cycle is generated at a same time as a reset signal for a current cycle), inconsistent operation may result. As a result, the first SR latch may perform a reset operation that might otherwise be overridden. Further, because the reset signal is generated based on an output of the first SR latch, the clock pulse generation circuit may prevent the reset signal from constantly overriding the set signal. Accordingly, in some embodiments, both set operations and reset operations may be performed, even if various factors (e.g., a cycle length of an external clock, process variations, etc.) may cause a timing of the set signal and reset signal to overlap. Additionally, because the set signal is generated based on the reset signal, an internal clock signal may be generated using a single pulse generator. Further, because the second SR latch is included, in some cases, the clock pulse generation circuit may prevent multiple set operations and multiple reset operations from occurring during a single clock cycle of the external clock.

As used herein, "asserted" refers to an active state of a signal. For example, a logically high signal being sent to an active-high circuit would be considered "asserted." Similarly, a logically low signal being sent to an active-low circuit would be considered "asserted."

Figure 1:
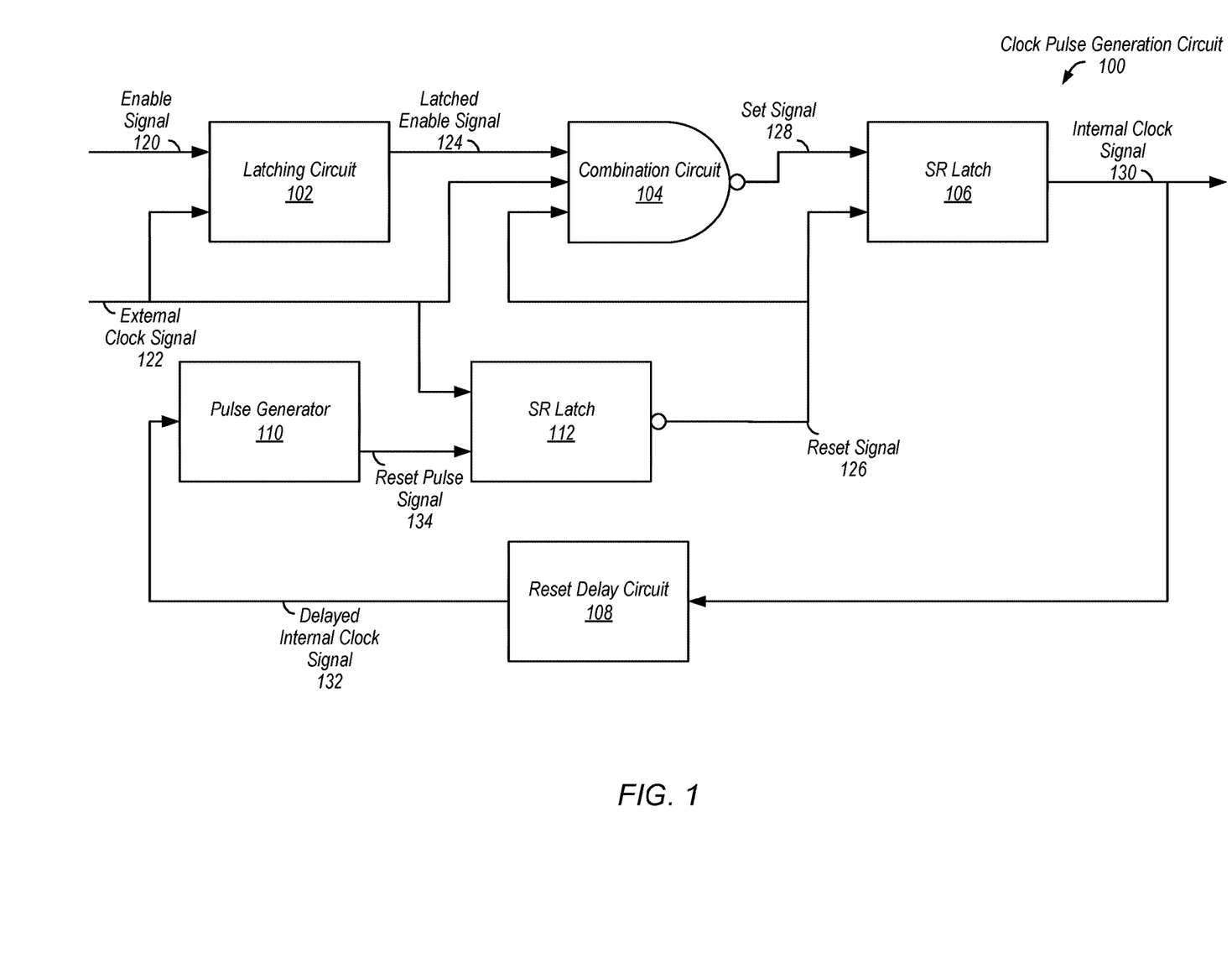
FIG. 1 is a block diagram illustrating one exemplary embodiment of a clock pulse generation circuit.

Turning now to FIG. 1, a simplified block diagram illustrating one embodiment of a clock pulse generation circuit 100 is shown. In some embodiments, clock pulse generation circuit 100 is a self-timed clock pulse generation circuit. In the illustrated embodiment, clock pulse generation circuit 100 includes latching circuit 102, combination circuit 104, set-reset (SR) latch 106, reset delay circuit 108, pulse generator 110, and SR latch 112. However, in other embodiments, other structural arrangements (e.g., additional circuits, fewer circuits, more inputs to depicted circuits, or fewer inputs to depicted circuits) are contemplated. For example, as further discussed below, in some embodiments, clock pulse generation circuit 100 may not include latching circuit 102, reset delay circuit 108, or both. Further, in some embodiments, reset delay circuit 108 may be disposed between pulse generator 110 and SR latch 112. As another example, in some embodiments, various additional other circuits, such as buffers, latches, or the cycle mode circuit discussed below with reference to FIGS. 3A-C may be included. For example, as further discussed below, multiple instances of SR latch 112 may be included, where one SR latch generates the reset signal for SR latch 106 and the other SR latch provides an indication of the reset signal for combination circuit 104. Further, based on the structural arrangement, various outputs may be inverted or not inverted. For example, as illustrated in FIG. 1, SR latch 106 generates a non-inverted output, but SR latch 112 generates an inverted output. However, if clock pulse generation circuit 100 had a different structural arrangement, these outputs may be inverted (or not inverted) differently.

Latching circuit 102 may latch enable signal 120 based on external clock signal 122, generating latched enable signal 124. In particular, latching circuit 102 may receive enable signal 120 and external clock signal 122 (e.g., from one or more external processors). In response to external clock signal 122, latching circuit 102 may output changes to enable signal 120 as latched enable signal 124. In various embodiments, latching circuit 102 may be a latch or flip-flop, such as a D latch or flip-flop, an SR latch, a JK flip-flop, or another data storage element. Enable signal 120 may be a memory enable signal such as a random access memory (RAM) enable signal.

Combination circuit 104 may generate set signal 128 based on a plurality of inputs. In the illustrated embodiment, combination circuit 104 is a three input NAND gate that generates set signal 128 based on latched enable signal 124, external clock signal 122, and reset signal 126. However, in other embodiments, combination circuit 104 may generate set signal 128 based on other combinations of inputs. For example, rather than receiving reset signal 126, combination circuit 104 may instead receive an indication of the value of reset signal 126. As another example, in some embodiments, clock pulse generation circuit may not include enable signal 120, latching circuit 102, or latched enable signal 124. In the example, combination circuit 104 may generate set signal 128 based on external clock signal 122 and reset signal 126. As a result, because set signal 128 is generated based on reset signal 126, in some embodiments, combination circuit 104 may prevent set signal 128 from being asserted when reset signal 126 is asserted. Accordingly, in some cases, combination circuit 104 may prevent SR latch 106 from performing two consecutive operations that are set operations. In some embodiments, multiple set signals may be received at SR latch 106, but only one set operation may occur (e.g., because at least one of the other set signals was overridden).

As further discussed below with reference to FIGS. 2B and 3B, SR latch 106 may receive a set and a reset signal (e.g., set signal 128 and reset signal 126) and may output internal clock signal 130 based on the set and reset signals. Based on set signal 128, SR latch 106 may perform set operations. Based on reset signal 126, SR latch 106 may perform reset operations. In some cases, internal clock signal 130 may differ from external clock signal 122 based on how set signal 128 and reset signal 126 are asserted.

Reset delay circuit 108 may include one or more delay circuits (e.g., buffers or latches) that delay internal clock signal 130 by a particular amount of time, generating delayed internal clock signal 132. The particular amount of time may correspond to a specified delay (e.g., an amount of time corresponding to a design of reset delay circuitry or a configurable amount of time, where reset delay circuit 108 includes configurable circuitry). Additionally or alternatively, the particular amount of time may be based on various other factors, such as a voltage received at reset delay circuit 108, an expected cycle time of internal clock signal 130, or both. In some embodiments, reset delay circuit 108 may add a self-timed clock reset delay to internal clock signal 130.

As further discussed below with reference to FIG. 2A, pulse generator 110 may receive an internal clock signal (e.g., delayed internal clock signal 132) and may generate reset pulse signal 134. In some embodiments, to generate reset pulse signal 134, pulse generator 110 may delay the received internal clock signal and combine the received internal clock signal with the delayed received internal clock signal to generate reset pulse signal 134.

As further discussed below with reference to FIGS. 2B and 3B, SR latch 112 may generate reset signal 126 based on reset pulse signal 134 and external clock signal 122. In particular, external clock signal 122 may trigger set operations at SR latch 112 and reset pulse signal 134 may trigger reset operations at SR latch 112. In the illustrated embodiment, SR latch 112 may be configured differently (e.g., using the same circuits in different arrangements or a different combination of circuits) from SR latch 106 such that if set and reset are asserted at the same time, reset may override set (e.g., as opposed to set overriding reset at SR latch 106). As discussed above, in the illustrated embodiment, reset signal 126 may be an inverted output of SR latch 112.

Figure 2A:
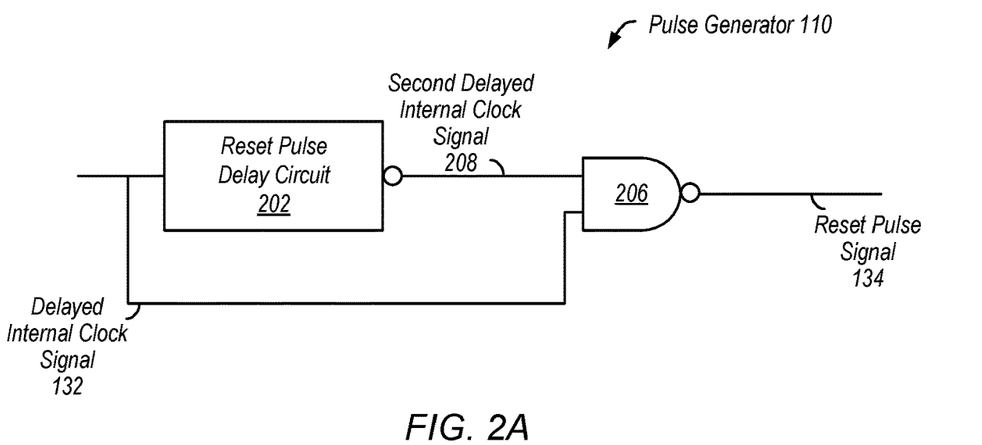
FIG. 2A is a block diagram illustrating one embodiment of an exemplary pulse generator of a clock pulse generation circuit.
Figure 2B:
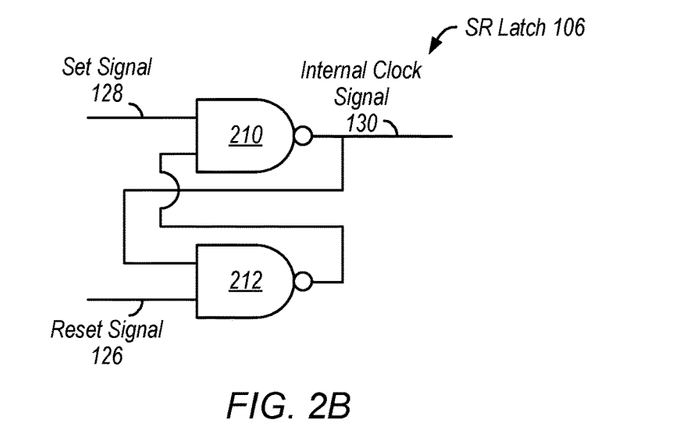
FIG. 2B is a block diagram illustrating one embodiment of an exemplary first latch of a clock pulse generation circuit.
Figure 2C:
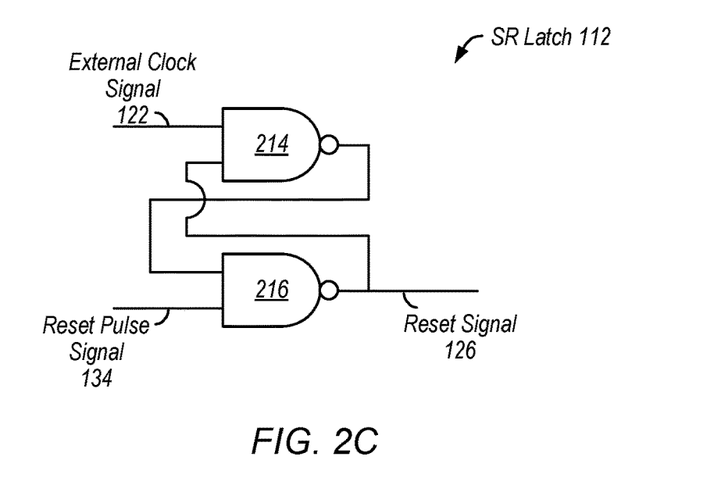
FIG. 2C is a block diagram illustrating one embodiment of an exemplary second latch of a clock pulse generation circuit.
Figure 3A:
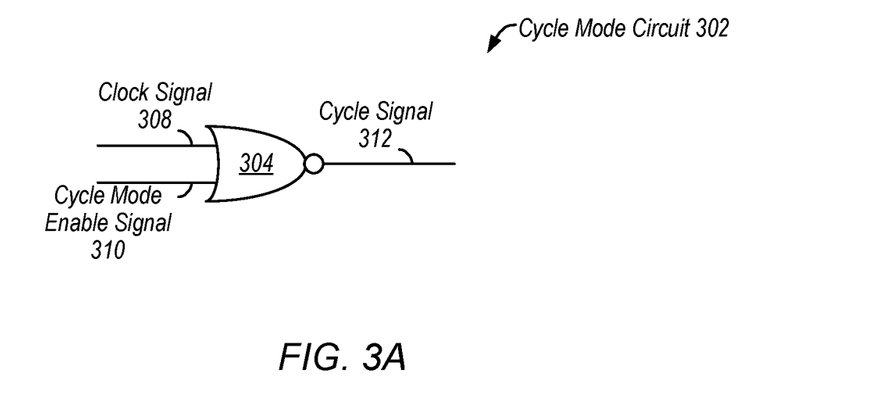
FIG. 3A is a block diagram illustrating one embodiment of an exemplary cycle mode circuit of a clock pulse generation circuit.
Figure 3B:
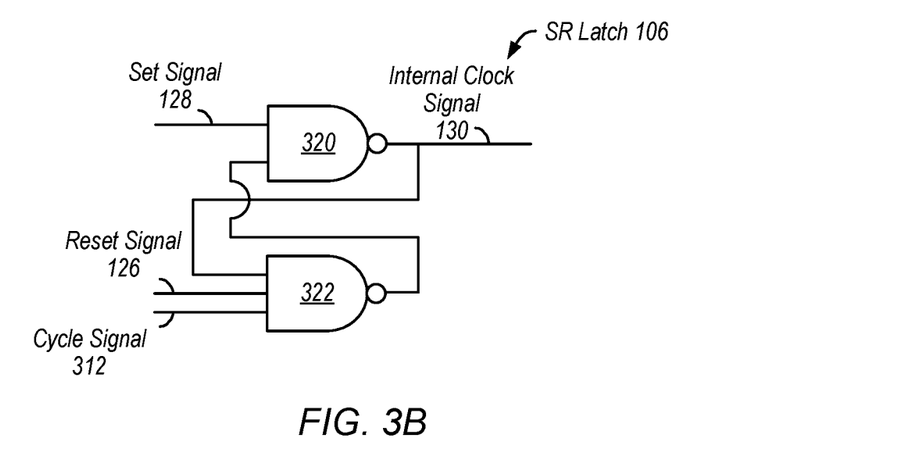
FIG. 3B is a block diagram illustrating one embodiment of an exemplary first latch of a clock pulse generation circuit.
Figure 3C:
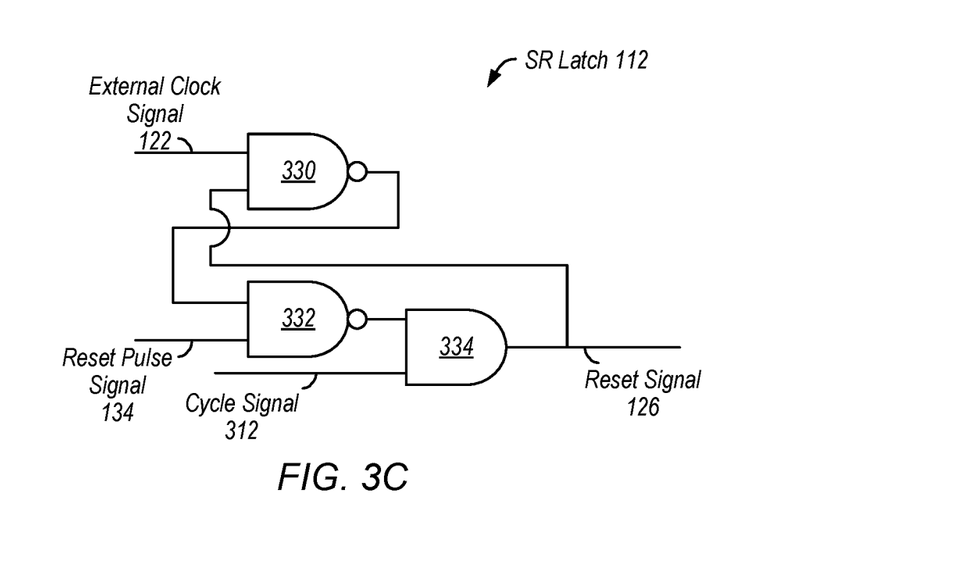
FIG. 3C is a block diagram illustrating one embodiment of an exemplary second latch of a clock pulse generation circuit.

FIGS. 2A-C and 3A-C depict various exemplary configurations of various circuits of clock pulse generation circuit 100. More specifically, FIGS. 2A-C illustrate specific embodiments of pulse generator 110, SR latch 106, and SR latch 112 of FIG. 1. FIGS. 3A-C illustrate different embodiments or SR latch 106 and SR latch 112 of FIG. 1 as well as illustrating cycle mode circuit 302, which, in some embodiments, may be included in FIG. 1. The concepts described herein may be considered separately or in combination. For example, in some embodiments, clock pulse generation circuit 100 may include pulse generator 110 of FIG. 2A, cycle mode circuit 302 of FIG. 3A, SR latch 106 of FIG. 3B, and SR latch 112 of FIG. 3C.

Turning now to FIG. 2A, a simplified block diagram illustrating one embodiment of pulse generator 110 is shown. In the illustrated embodiment, pulse generator 110 includes reset pulse delay circuit 202 and logic gate 206. In the illustrated embodiment, reset pulse delay circuit 202 receives an internal clock signal (e.g., delayed internal clock signal 132) and delays the internal clock signal by a particular amount, generating second delayed internal clock signal 208. In various embodiments, the delay may correspond to a specified delay (e.g., a delay specified by a device manufacturer when pulse generator 110 is fabricated or a delay specified by a user prior to generation of a particular internal clock signal). In various embodiments, a user may change the specified delay. In some embodiments, the delay may be based on a voltage received by pulse generator 110. In some embodiments, the delay may correspond to an expected cycle time of the received internal clock signal (e.g., delayed internal clock signal 132). Reset pulse delay circuit 202 may include one or more of various delay circuits, such as buffers or latches. In the illustrated embodiment, the output of reset pulse delay circuit 202 is an inverted output. In the illustrated embodiment, logic gate 206 may perform a logical NAND on delayed internal clock signal 132 second delayed internal clock signal 208. However, in other embodiments, other circuitry may be used (e.g. NOR gates). As another example, logic gate 206 may perform a logical OR on an inverted version of delayed internal clock signal 132 and an inverted version of second delayed internal clock signal 208 (e.g., by not inverting the output of reset pulse delay circuit 202 or by inverting the output of reset pulse delay circuit 202 an even number of times). Accordingly, pulse generator 110 may generate reset pulse signal 134 based on delayed internal clock signal 132.

Turning now to FIG. 2B, a simplified block diagram illustrating one embodiment of SR latch 106 is shown. In the illustrated embodiment, SR latch 106 includes cross coupled NAND gates 210 and 212. Set signal 128 may cause SR latch 106 to perform a set operation and reset signal 126 may cause SR latch 106 to perform a reset operation. In other embodiments, other SR latches may be used (e.g., cross coupled NOR gates, where set signal 128 and reset signal 126 are inverted). In the illustrated embodiment, because internal clock signal 130 is generated based on an output of NAND gate 210, if set signal 128 and reset signal 126 were asserted at the same time, in some cases, set signal 128 may override reset signal 126. However, as discussed above, because, in the illustrated embodiment, set signal 128 is generated based on reset signal 126, set signal 128 may be prevented from, in some cases, overriding reset signal 126.

Turning now to FIG. 2C, a simplified block diagram illustrating one embodiment of SR latch 112 is shown. In the illustrated embodiment, SR latch 112 includes cross coupled NAND gates 214 and 216. External clock signal 122 may cause SR latch 112 to perform a set operation and reset pulse signal 134 may cause SR latch 112 to perform a reset operation. In other embodiments, other SR latches may be used (e.g., cross coupled NOR gates, where external clock signal 122 and reset pulse signal 134 are inverted). In the illustrated embodiment, because reset signal 126 is generated based on an output of NAND gate 216, if external clock signal 122 and reset pulse signal 134 were asserted at the same time, in some cases, reset pulse signal 134 may override external clock signal 122.

Turning now to FIG. 3A, a simplified block diagram illustrating one embodiment of cycle mode circuit 302 is shown. In the illustrated embodiment, cycle mode circuit 302 includes logic gate 304. In the illustrated embodiment, logic gate 304 is a NOR gate. However, as discussed above, in other embodiments, other logic circuits may be used. As discussed above, in some embodiments, cycle mode circuit 302 may be included in clock pulse generation circuit 100. Cycle mode circuit 302, in conjunction with SR latch 106 of FIG. 3B and SR latch 112 of FIG. 3C may cause clock pulse generation circuit 100 to perform a reset operation. In particular, logic gate 304 may receive clock signal 308 and cycle mode enable signal 310. In the illustrated embodiment, clock signal 308 is a reset signal. However, in other embodiments, clock signal 308 may be a clamp signal or a different clock signal from external clock signal 122. Logic gate may generate cycle signal 312 based on clock signal 308 and cycle mode enable signal 310. In some embodiments, as a result of cycle mode circuit 302, SR latch 106 may output a delayed version of external clock signal 122.

Turning now to FIG. 3B, a simplified block diagram illustrating one embodiment of SR latch 106 is shown. In the illustrated embodiment, SR latch 106 includes cross coupled NAND gates 320 and 322. Similar to FIG. 2B, set signal 128 may cause SR latch 106 to perform a set operation. Further, when cycle signal 312 is asserted, reset signal 126 may cause SR latch 106 to perform a reset operation. Accordingly, cycle signal 312 may be used to force internal clock signal 130 into a known state (e.g., the same as external clock signal 122). Similar to SR latch 106 of FIG. 2B, in other embodiments, other SR latches may be used.

Turning now to FIG. 3C, a simplified block diagram illustrating one embodiment of SR latch 112 is shown. In the illustrated embodiment, SR latch 112 includes cross coupled NAND gates 330 and 332 and AND gate 334. Similar to FIG. 2C, external clock signal 122 may cause SR latch 112 to perform a set operation. Further, when cycle signal 312 is asserted, and reset pulse signal 134 may cause SR latch 112 to perform a reset operation. Accordingly, cycle signal 312 may be used to force internal clock signal 130 into a known state (e.g., the same as external clock signal 122). Similar to SR latch 112 of FIG. 2C, in other embodiments, other SR latches may be used.

Figure 4:
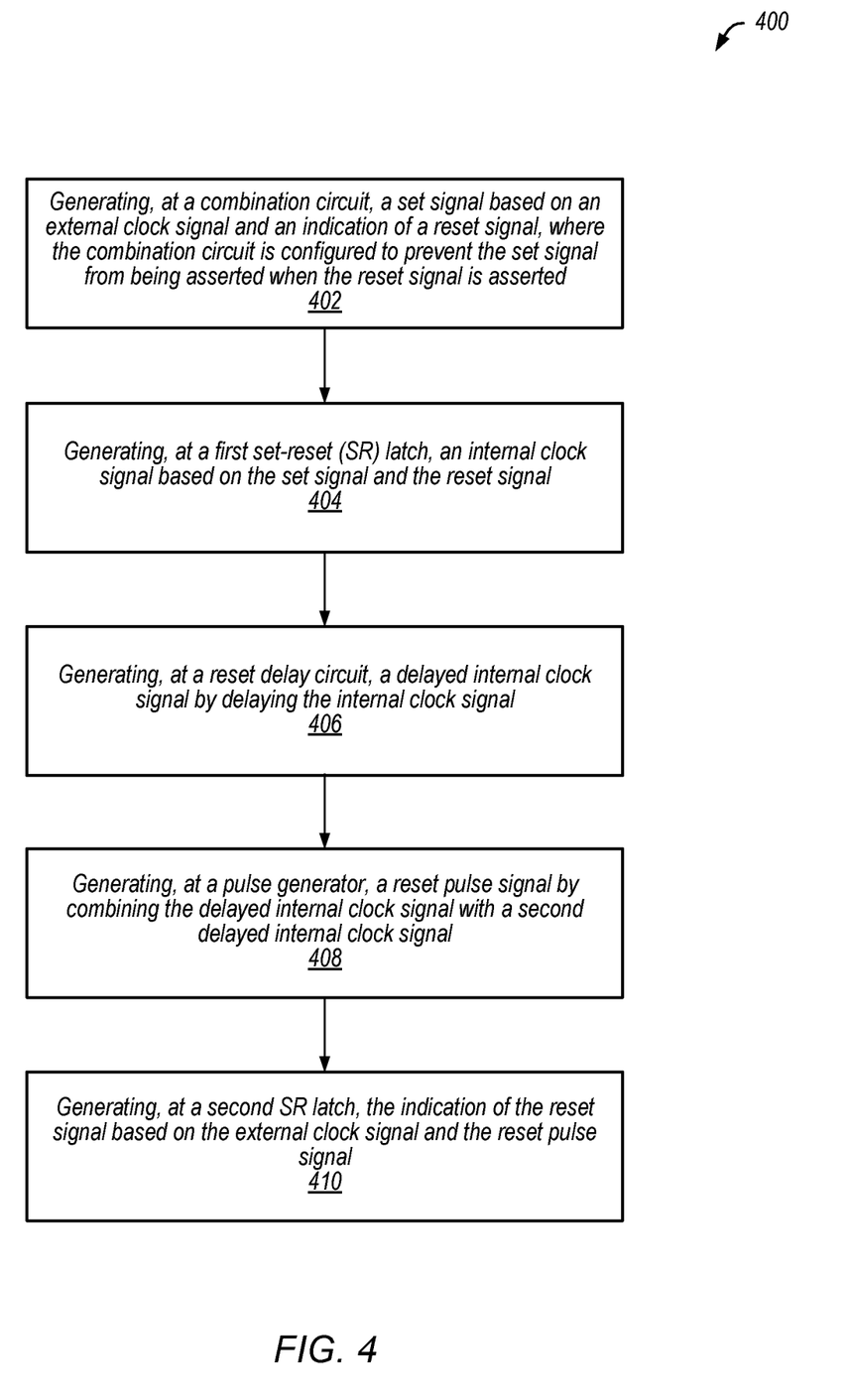
FIG. 4 is a flow diagram illustrating one embodiment of a method of generating an internal clock signal.

Referring now to FIG. 4, a flow diagram of a method 400 of generating an internal clock signal is depicted. In some embodiments, method 400 may be initiated or performed by one or more processors in response to one or more instructions stored by a computer-readable storage medium.

At 402, method 400 includes generating, at a combination circuit, a set signal based on an external clock signal and an indication of a reset signal, where the combination circuit is configured to prevent the set signal from being asserted when the reset signal is asserted. For example, combination circuit 104 of FIG. 1 may generate set signal 128 based on external clock signal 122 and reset signal 126.

At 404, method 400 includes generating, at a first set-reset (SR) latch, an internal clock signal based on the set signal and the reset signal. For example, SR latch 106 may generate internal clock signal 130 based on set signal 128 and reset signal 126.

At 406, method 400 includes generating, at a reset delay circuit, a delayed internal clock signal by delaying the internal clock signal. For example, reset delay circuit 108 may delay internal clock signal 130 to generate delayed internal clock signal 132.

At 408, method 400 includes generating, at a pulse generator, a reset pulse signal by combining the delayed internal clock signal with a second delayed internal clock signal. For example, delayed internal clock signal 132 may be combined with an output of reset pulse delay circuit 202 of FIG. 2 by logic gate 206 to generate reset pulse signal 134.

At 410, method 400 includes generating, at a second SR latch, the indication of the reset signal based on the external clock signal and the reset pulse signal. For example, SR latch 112 may generate reset signal 126 based on external clock signal 122 and reset pulse signal 134. Alternatively, SR latch 112 may generate an indication of a value of reset signal 126 and reset signal 126 may be generated by other circuitry. Accordingly, a method of generating an internal clock signal is depicted.

Figure 5:
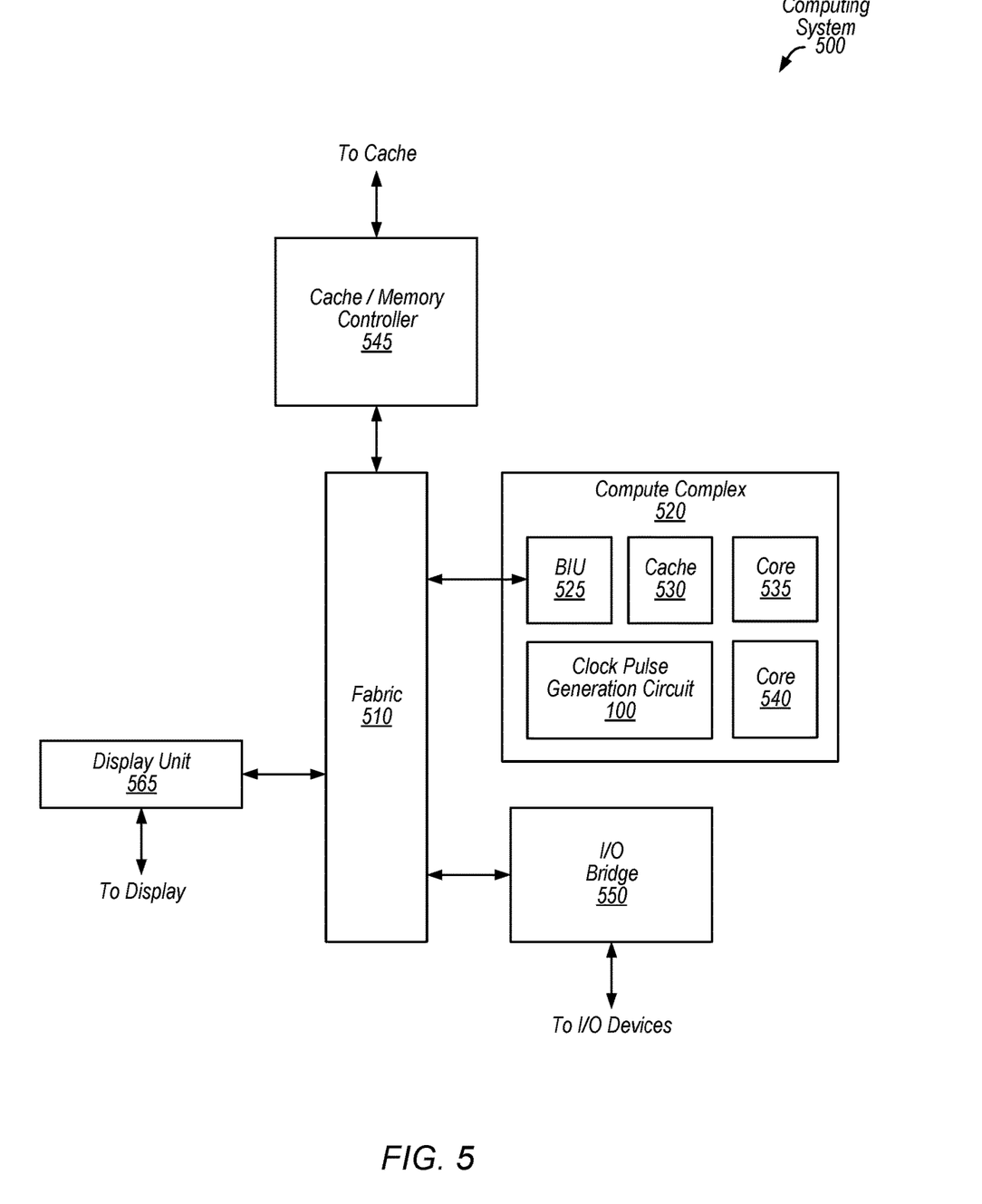
FIG. 5 is block diagram illustrating an embodiment of a computing system that includes at least a portion of a clock pulse generation circuit.

Turning next to FIG. 5, a block diagram illustrating an exemplary embodiment of a computing system 500 that includes at least a portion of a clock pulse generation circuit. The computing system 500 includes clock pulse generation circuit 100 of FIG. 1. In some embodiments, clock pulse generation circuit 100 includes one or more of the circuits described above with reference to FIG. 1, including any variations or modifications described previously with reference to FIGS. 1-4. In some embodiments, some or all elements of the computing system 500 may be included within a system on a chip (SoC). In some embodiments, computing system 500 is included in a mobile device. Accordingly, in at least some embodiments, area and power consumption of the computing system 500 may be important design considerations. In the illustrated embodiment, the computing system 500 includes fabric 510, compute complex 520, input/output (I/O) bridge 550, cache/memory controller 545, and display unit 565. Although the computing system 500 illustrates clock pulse generation circuit 100 as being located within compute complex 520, in other embodiments, computing system 500 may include clock pulse generation circuit 100 in other locations (e.g., connected to or included in cache/memory controller 545) or may include multiple instances of clock pulse generation circuit 100. The clock pulse generation circuits 100 may correspond to different embodiments or to the same embodiment.

Fabric 510 may include various interconnects, buses, MUXes, controllers, etc., and may be configured to facilitate communication between various elements of computing system 500. In some embodiments, portions of fabric 510 are configured to implement various different communication protocols. In other embodiments, fabric 510 implements a single communication protocol and elements coupled to fabric 510 may convert from the single communication protocol to other communication protocols internally.

In the illustrated embodiment, compute complex 520 includes bus interface unit (BIU) 525, cache 530, cores 535 and 540, and clock pulse generation circuit 100. In some embodiments, cache 530, cores 535 and 540, other portions of compute complex 520, or a combination thereof may be hardware resources. In various embodiments, compute complex 520 includes various numbers of cores and/or caches. For example, compute complex 520 may include 1, 2, or 4 processor cores, or any other suitable number. In some embodiments, cores 535 and/or 540 include internal instruction and/or data caches. In some embodiments, a coherency unit (not shown) in fabric 510, cache 530, or elsewhere in computing system 500 is configured to maintain coherency between various caches of computing system 500. BIU 525 may be configured to manage communication between compute complex 520 and other elements of computing system 500. Processor cores such as cores 535 and 540 may be configured to execute instructions of a particular instruction set architecture (ISA), which may include operating system instructions and user application instructions.

Cache/memory controller 545 may be configured to manage transfer of data between fabric 510 and one or more caches and/or memories (e.g., non-transitory computer readable mediums). For example, cache/memory controller 545 may be coupled to an L3 cache, which may, in turn, be coupled to a system memory. In other embodiments, cache/memory controller 545 is directly coupled to a memory. In some embodiments, the cache/memory controller 545 includes one or more internal caches. In some embodiments, the cache/memory controller 545 may include or be coupled to one or more caches and/or memories that include instructions that, when executed by one or more processors (e.g., compute complex 520), cause the processor, processors, or cores to initiate or perform some or all of the processes described above with reference to FIGS. 1-4 or below with reference to FIG. 6. In some embodiments, one or more portions of the caches/memories may correspond to hardware resources.

As used herein, the term "coupled to" may indicate one or more connections between elements, and a coupling may include intervening elements. For example, in FIG. 5, display unit 565 may be described as "coupled to" compute complex 520 through fabric 510. In contrast, in the illustrated embodiment of FIG. 5, display unit 565 is "directly coupled" to fabric 510 because there are no intervening elements.

Display unit 565 may be configured to read data from a frame buffer and provide a stream of pixel values for display. Display unit 565 may be configured as a display pipeline in some embodiments. Additionally, display unit 565 may be configured to blend multiple frames to produce an output frame. Further, display unit 565 may include one or more interfaces (e.g., MIPI® or embedded display port (eDP)) for coupling to a user display (e.g., a touchscreen or an external display). In some embodiments, one or more portions of display unit 565 may be hardware resources.

I/O bridge 550 may include various elements configured to implement: universal serial bus (USB) communications, security, audio, and/or low-power always-on functionality, for example. I/O bridge 550 may also include interfaces such as pulse-width modulation (PWM), general-purpose input/output (GPIO), serial peripheral interface (SPI), and/or inter-integrated circuit (I2C), for example. Various types of peripherals and devices may be coupled to computing system 500 via I/O bridge 550. In some embodiments, clock pulse generation circuit 100 may be coupled to computing system 500 via I/O bridge 550. In some embodiments, one or more devices coupled to I/O bridge 550 may be hardware resources.

Figure 6:
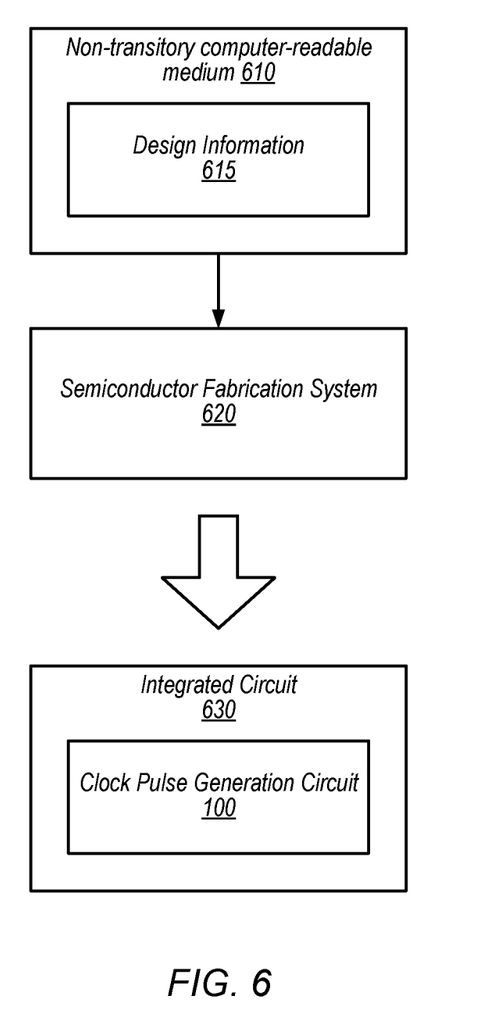
FIG. 6 is a block diagram illustrating one embodiment of a process of fabricating at least a portion of a processing circuit that includes a clock pulse generation circuit.

FIG. 6 is a block diagram illustrating a process of fabricating at least a portion of a clock pulse generation circuit. FIG. 6 includes a non-transitory computer-readable medium 610 and a semiconductor fabrication system 620. Non-transitory computer-readable medium 610 includes design information 615. FIG. 6 also illustrates a resulting fabricated integrated circuit 630. In the illustrated embodiment, integrated circuit 630 includes clock pulse generation circuit 100 of FIG. 1. However, in other embodiments, integrated circuit 630 may only include one or more portions of clock pulse generation circuit 100 (e.g., SR latch 106). In some embodiments, integrated circuit 630 may include different embodiments of clock pulse generation circuit 100 (e.g., corresponding to FIGS. 3A-C). In the illustrated embodiment, semiconductor fabrication system 620 is configured to process design information 615 stored on non-transitory computer-readable medium 610 and fabricate integrated circuit 630.

Non-transitory computer-readable medium 610 may include any of various appropriate types of memory devices or storage devices. For example, non-transitory computer-readable medium 610 may include at least one of an installation medium (e.g., a CD-ROM, floppy disks, or tape device), a computer system memory or random access memory (e.g., DRAM, DDR RAM, SRAM, EDO RAM, Rambus RAM, etc.), a non-volatile memory such as a Flash, magnetic media (e.g., a hard drive, or optical storage), registers, or other types of non-transitory memory. Non-transitory computer-readable medium 610 may include two or more memory mediums, which may reside in different locations (e.g., in different computer systems that are connected over a network).

Design information 615 may be specified using any of various appropriate computer languages, including hardware description languages such as, without limitation: VHDL, Verilog, SystemC, SystemVerilog, RHDL, M, MyHDL, etc. Design information 615 may be usable by semiconductor fabrication system 620 to fabricate at least a portion of integrated circuit 630. The format of design information 615 may be recognized by at least one semiconductor fabrication system 620. In some embodiments, design information 615 may also include one or more cell libraries, which specify the synthesis and/or layout of integrated circuit 630. In some embodiments, the design information is specified in whole or in part in the form of a netlist that specifies cell library elements and their connectivity.

Design information 615, taken alone, may or may not include sufficient information for fabrication of a corresponding integrated circuit (e.g., integrated circuit 630). For example, design information 615 may specify circuit elements to be fabricated but not their physical layout. In this case, design information 615 may be combined with layout information to fabricate the specified integrated circuit.

Semiconductor fabrication system 620 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 620 may also be configured to perform various testing of fabricated circuits for correct operation.

In various embodiments, integrated circuit 630 is configured to operate according to a circuit design specified by design information 615, which may include performing any of the functionality described herein. For example, integrated circuit 630 may include any of various elements described with reference to FIGS. 1-5. Further, integrated circuit 630 may be configured to perform various functions described herein in conjunction with other components. The functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

In some embodiments, a method of initiating fabrication of integrated circuit 630 is performed. Design information 615 may be generated using one or more computer systems and stored in non-transitory computer-readable medium 610. The method may conclude when design information 615 is sent to semiconductor fabrication system 620 or prior to design information 615 being sent to semiconductor fabrication system 620. Accordingly, in some embodiments, the method may not include actions performed by semiconductor fabrication system 620. Design information 615 may be sent to semiconductor fabrication system 620 in a variety of ways. For example, design information 615 may be transmitted (e.g., via a transmission medium such as the Internet) from non-transitory computer-readable medium 610 to semiconductor fabrication system 620 (e.g., directly or indirectly). As another example, non-transitory computer-readable medium 610 may be sent to semiconductor fabrication system 620. In response to the method of initiating fabrication, semiconductor fabrication system 620 may fabricate integrated circuit 630 as discussed above.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a first latch circuit configured to generate initiate a pulse on a first clock signal using a second clock signal;
   a delay circuit configured to generate a delayed version of the first clock signal;
   a second latch circuit configured to generate a reset signal using the second clock signal and the delayed version of the first clock signal; and
   wherein the first latch circuit is further configured to terminate the pulse on the first clock signal using the reset signal.

2. The apparatus of claim 1, further comprising, a third latch circuit configured to latch an enable signal using the second clock signal to generate a latched version of the enable signal.

3. The apparatus of claim 2, wherein the first latch circuit is further configured to initiate the pulse on the first clock signal using the second clock signal and the latched version of the enable signal.

4. The apparatus of claim 2, further comprising a pulse generation circuit configured to generate a pulse signal using the delayed version of the first clock signal.

5. The apparatus of claim 4, wherein the second latch circuit is further configured to:
   activate the reset signal using the second clock signal; and
   deactivate the reset signal using the pulse signal.

6. The apparatus of claim 4, further comprising a combination circuit configured to combine the latched version of the enable signal, the second clock signal, and the reset signal to generate a set signal, and wherein the first latch circuit is further configured to initiate the pulse on the first clock signal using the set signal.

7. A method, comprising:
   initiating, by a first latch circuit, a pulse on a first clock signal using a second clock signal;
   generating, by a delay circuit, a delayed version of the first clock signal;
   generating, by a second latch circuit, a reset signal using the second clock signal and the delayed version of the first clock signal; and
   terminating, by the first latch circuit, the pulse on the first clock signal using the reset signal.

8. The method of claim 7, further comprising latching, using the second clock signal, an enable signal to generate a latched version of the enable signal.

9. The method of claim 8, further comprising initiating the pulse on the first clock signal using the second clock signal and the latched version of the enable signal.

10. The method of claim 8, wherein generating the reset signal incudes generating a pulse signal using the delayed version of the first clock signal.

11. The method of claim 10, further comprising:
    activating the reset signal using the latched version of the second clock signal; and
    deactivating the reset signal using the pulse signal.

12. The method of claim 10, further comprising initiating the pulse on the first clock signal using the second clock signal, the latched version of the enable signal and the reset signal.

13. The method of claim 7, further comprising determining a duration of a delay period using a cycle time of the second clock signal, and generating the delayed version of the second clock signal using the delay period.

14. An apparatus, comprising:
a memory controller; and
a compute complex coupled to the memory controller via a switch fabric, wherein the compute complex includes a clock pulse generation circuit configured to:
receive an external clock signal and an enable signal;
generate a latched version of the enable signal using the external clock signal;
initiate a pulse on an internal clock signal using the external clock signal, the latched version of the enable signal, and a reset signal;
generate a delayed version of the internal clock signal;
generate the reset signal using the delayed version of the internal clock signal and the external clock signal; and
terminate the pulse on the internal clock signal using the reset signal; and
wherein the compute complex further includes a processor core configured to communication with the memory controller using the internal clock signal.

15. The apparatus of claim 14, wherein the clock pulse generation circuit includes a first latch circuit configured to latch, using the external clock signal, the enable signal to generate the latched version of the enable signal.

16. The apparatus of claim 15, wherein the clock pulse generation circuit includes a second latch circuit, and wherein the clock pulse generation circuit is further configured to set the second latch circuit using the external clock signal and the latched version of the enable signal to initiate the pulse on the internal clock signal.

17. The apparatus of claim 15, wherein the clock pulse generation circuit is further configured to generate a pulse signal using the delayed version of the internal clock signal.

18. The apparatus of claim 17, wherein the clock pulse generation circuit is further configured to activate the reset signal using the external clock signal.

19. The apparatus of claim 18, wherein the clock pulse generation circuit is further configured to
deactivate the reset signal using the pulse signal.

20. The apparatus of claim 19, wherein the clock pulse generation circuit is further configured to:
combine the latched version of the enable signal, the external clock signal, and the reset signal to generate a set signal, and
initiate the pulse on the internal clock signal using the set signal.

* * * * *

UNITED STATES PATENT AND TRADEMARK OFFICE
CERTIFICATE OF CORRECTION

PATENT NO. : 11,038,492 B2  
APPLICATION NO. : 16/544591  
DATED : June 15, 2021  
INVENTOR(S) : Steven F. Schicht et al.

Page 1 of 1

It is certified that error appears in the above-identified patent and that said Letters Patent is hereby corrected as shown below:

In the Claims

Column 12, Line 14-15 Claim 1, delete "a first latch circuit configured to generate initiate a pulse on a first clock signal using a second clock signal;" and insert -- a first latch circuit configured to initiate a pulse on a first clock signal using a second clock signal; --.

Signed and Sealed this  
Fourth Day of January, 2022

Drew Hirshfeld  
*Performing the Functions and Duties of the*  
*Under Secretary of Commerce for Intellectual Property and*  
*Director of the United States Patent and Trademark Office*